(12) United States Patent
Cruse et al.

(10) Patent No.: US 7,955,646 B2
(45) Date of Patent: Jun. 7, 2011

(54) ELIMINATION OF FLOW AND PRESSURE GRADIENTS IN LOW UTILIZATION PROCESSES

(75) Inventors: James P. Cruse, Capitola, CA (US); Andreas G. Hegedus, Burlingame, CA (US); Satheesh Kuppurao, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 1118 days.

(21) Appl. No.: 10/914,964

(22) Filed: Aug. 9, 2004

(65) Prior Publication Data
US 2006/0029747 A1    Feb. 9, 2006

(51) Int. Cl.
*C23C 16/00*    (2006.01)

(52) U.S. Cl. ....... 427/248.1; 432/58; 432/706; 432/710; 432/712; 432/714; 432/720; 438/656; 118/715; 427/255; 427/255.2

(58) Field of Classification Search ............... 438/656, 438/706, 710; 432/58; 427/248.1
See application file for complete search history.

(56) References Cited

U.S. PATENT DOCUMENTS

| | | | |
|---|---|---|---|
| 5,728,425 A * | 3/1998 | Ebe et al. ............ | 427/248.1 |
| 6,426,305 B1 | 7/2002 | Chou et al. | |
| 6,503,846 B1 | 1/2003 | Niimi et al. | |
| 6,528,434 B2 | 3/2003 | Chen | |
| 6,548,366 B2 | 4/2003 | Niimi et al. | |
| 6,566,205 B1 | 5/2003 | Yu et al. | |
| 6,593,244 B1 * | 7/2003 | Wang et al. ............ | 438/706 |
| 6,627,463 B1 | 9/2003 | Sarfaty | |
| 6,649,538 B1 | 11/2003 | Cheng et al. | |
| 6,660,659 B1 | 12/2003 | Kraus et al. | |
| 6,667,251 B2 | 12/2003 | McFadden et al. | |
| 6,727,169 B1 | 4/2004 | Raaijmakers et al. | |
| 2003/0087215 A1 * | 5/2003 | Yoo ......................... | 432/58 |

(Continued)

FOREIGN PATENT DOCUMENTS

WO  PCT/US2005/027893    8/2005

OTHER PUBLICATIONS

Tseng et al., Ultra-Thin Decoupled Plasma Nitridation (DPN) Oxynitride Gate Dielectric for 80-nm Advanced Technology, Dec. 2002, IEEE Electron Device Letters, vol. 23, No. 12, pp. 1-3 as given.*

(Continued)

*Primary Examiner* — Michael Barr
*Assistant Examiner* — Andrew Bowman
(74) *Attorney, Agent, or Firm* — Blakely Sokoloff Taylor & Zafman, LLP

(57) ABSTRACT

The amount of atoms diffused into a substrate may be made uniform or the thickness of a thin film may be made uniform in a low species utilization process by stopping the flow of gas into a reaction chamber during the low species utilization process. Stopping the flow of gas into a reaction chamber may entail closing the gate valve (the valve to the vacuum pump), stabilizing the pressure within the reaction chamber, and maintaining the stabilized pressure while stopping the gas flowing into the chamber. Low species utilization processes include the diffusion of nitrogen into silicon dioxide gate dielectric layers by decoupled plasma nitridation (DPN), the deposition of a silicon dioxide film by rapid thermal processing (RTP) or chemical vapor deposition (CVD), and the deposition of silicon epitaxial layers by CVD.

17 Claims, 10 Drawing Sheets

U.S. PATENT DOCUMENTS

2003/0129826 A1    7/2003    Werkhoven et al.
2004/0038525 A1*   2/2004    Meng et al. .................... 438/656
2006/0228473 A1*  10/2006   Satoh et al. ................ 427/248.1

OTHER PUBLICATIONS

Kim et al., Characteristics of TiN Films Deposited by Remote Plasma-Enhanced Atomic Layer Deposition Method, Apr. 15, 2003, Japanese Journal of Applied Physics, vol. 42, Part 2 No. 4B, pp. L414-416.*

Kim et al. Characteristics of TiN Films Depsoited by Remote Plasma-Enhanced AAtomic Layer Depositoin Method, Apr. 2003, Japanese Journal of Applied Physics, vol. 42, pp. 414-416.*

Tseng et. al., Ultra-Thin Decoupled Plasma Nitridation (DPN) Oxynitride Gate Dielectric for 80-nm Advanced Technology, Dec. 2002, IEEE Electron Device Letters, vol. 23, pp. 704-706.*

Yeo, K.L., "Investigation of Boron Penetration Through Decoupled Plasma Nitrided Gate Oxide Using Backside Secondary Ion Mass Spectrometry Depth Profiling", J.Vac. Sci. Technology B 21(1), Jan./Feb. 2003, 2003 American Vacuum Society, pp. 193-197.

Jeong, Chang-Wook et al., "Growth and Characterization of Aluminum Oxide Films by Plasma-Assisted Atomic Layer Deposition", Elsevier Materials, Science & Engineering C 16(2001), pp. 59-64, XP-001134950.

Lee, Yong Ju, "Formation of Aluminum Nitride Thin Films as Gate Dielectrics on Si (100)", Elsevier Journal of Crystal Growth 266 (2004), pp. 568-572.

Kim, Ju Youn et al., "Remote Plasma Enhanced Atomic Layer Deposition of TiN Thin Films Using Metalorganic Precursor", J. Vac. Sci. Technology A 22(1), Jan./Feb. 2004, pp. 8-12.

Weidenkaff, A. et al. "Nucleation and Growth of Epitaxial La1-xCaxCoO3-8 Films on Single Crystalline Substrates by Pulsed Reactive Crossed-Beam Laser Ablation", Elsevier Thin Sold Films 453-454 (2004), pp. 406-410.

Lim, Sam Woo, et al., "Mechanism of Silicon Dioxide Decoupled Plasma Nitradation", Japanese Journal of Applied Physics, Apr. 7, 2006, pp. L413-L415, vol. 45, No. 15, The Japan Society of Applied Physics.

* cited by examiner

ELIMINATION OF FLOW AND PRESSURE GRADIENTS IN LOW UTILIZATION PROCESSES

BACKGROUND OF THE INVENTION

1. Field of the Invention

The present invention relates to the field of semiconductor fabrication and processing and more particularly to low utilization processes accomplished by decoupled plasma nitridation, rapid thermal processing, and chemical vapor deposition.

2. Discussion of Related Art

Low species utilization processes include the diffusion of nitrogen into silicon dioxide gate dielectric layers by decoupled plasma nitridation (DPN), the deposition of a silicon dioxide film by rapid thermal processing (RTP) or chemical vapor deposition (CVD), and the deposition of silicon epitaxial layers by CVD. In each of these low species utilization processes it is valuable to obtain a diffusion of atoms or a thin film that is very uniform across the substrate on which the process is performed. This is because as devices are further scaled down, they require thinner films and lower concentration diffusion of atoms into a substrate. Thinner films and lower concentration diffusion of atoms into a substrate in turn require that the variation in film thickness or diffusion concentration across a substrate be insignificant.

Nitride diffusion into a silicon dioxide gate dielectric may be performed in a decoupled plasma nitridation (DPN) chamber. Nitrogen gas is flowed into the chamber containing the substrate on which the silicon dioxide gate dielectric is formed and a plasma is struck while the flow continues. The plasma ionizes the nitrogen and the ionized nitrogen then diffuses into the silicon dioxide gate dielectric.

The formation of a silicon dioxide film by rapid thermal processing (RTP) may be performed in an RTP chamber. Hydrogen ($H_2$) and oxygen ($O_2$) gas is flowed into the RTP chamber and a silicon substrate is heated up to a temperature at which the hydrogen and oxygen gases react with the silicon substrate to form a silicon dioxide layer.

The formation of an epitaxial layer by chemical vapor deposition (CVD) may be performed in a CVD chamber. A precursor gas of the type of material to be deposited is flowed into the chamber, often along with a carrier or diluent gas. The chamber is heated to a temperature at which the precursor gases react to form a vapor and form a film on a substrate while the gas is flowed through the chamber.

Throughout each of these processes, gas is flowed through the chamber and the pressure within the chamber may be different in different parts of the chamber. The pressure gradients may be due to the constant flow of gases into the chamber and the flow of gases pumped out of the chamber. These flow and pressure gradients may be a primary factor in causing nonuniformity across a substrate of the amounts of atoms diffused into the substrate or of the thickness of a film formed on the substrate.

Several modifications to the reaction chambers have been made to reduce the nonuniformity caused by flow and pressure gradients. These modifications include pumping plates, gas distribution plates, and showerheads. Pumping plates are designed to control the flow and pressure gradients caused by the flow of gas into and out of the chamber. Gas distribution plates are designed to evenly distribute gas throughout the chamber to overcome non-uniform distribution of gas caused by the flow and pressure gradients. Showerheads are designed to distribute the gas flowed into the chamber in a particular way to overcome the flow and pressure gradients.

These modifications to the reaction chambers can help reduce pressure and flow gradients created by the flow of gases from the supply to the pump. But, these modifications do not provide enough uniformity for processes, and in particular low utilization processes where the consumption of the reactant is relatively insignificant.

SUMMARY OF THE INVENTION

According to one aspect of the invention, a low species utilization process is performed within a reaction chamber by flowing a gas into the reaction chamber, stopping the flow of the gas into the reaction chamber once the pressure within the chamber has stabilized, and performing the low species utilization process within the chamber after stopping the flow of gas into the chamber. The low species utilization process may be decoupled plasma nitridation, the deposition of a film by rapid thermal processing, or the deposition of a film by chemical vapor deposition.

According to another aspect of the invention, a reaction chamber designed for no-flow processing is described.

DETAILED DESCRIPTION OF THE PRESENT INVENTION

Figure 1:
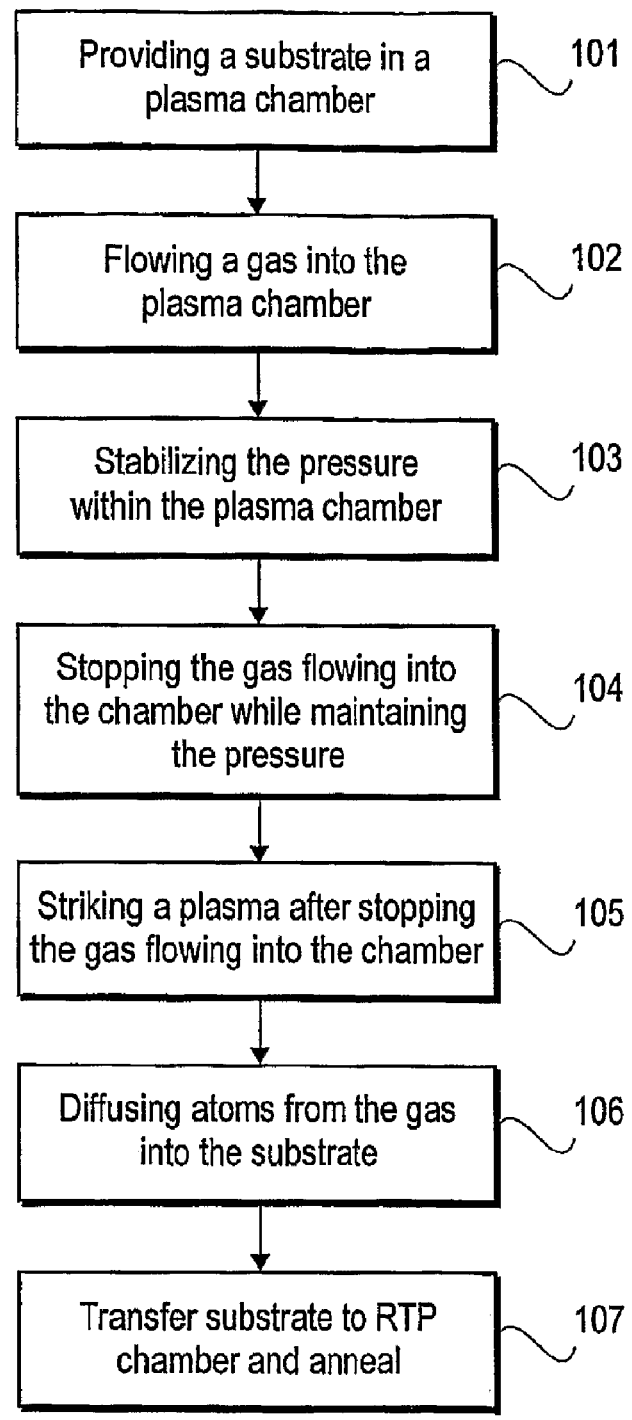
FIG. 1 is a flow chart of a decoupled plasma nitridation process according to an embodiment of the present invention.

In the following description numerous specific details are set forth in order to provide a thorough understanding of the present invention. One of ordinary skill in the art will understand that these specific details are for illustrative purposes only and are not intended to limit the scope of the present invention. Additionally, in other instances, well-known processing techniques and equipment have not been set forth in particular detail in order to not unnecessarily obscure the present invention.

The amount of atoms diffused into a substrate may be made uniform in a low species utilization process by stopping the flow of gas into a reaction chamber during the low species utilization process. Stopping the flow of gas into a reaction chamber may entail closing the gate valve (the valve to the vacuum pump), stabilizing the pressure within the reaction chamber, and maintaining the stabilized pressure while stopping the gas flowing into the chamber. Likewise, the thickness of a thin film may be made uniform in a low species utilization processes by stopping the flow of gas into a reaction chamber during the low species utilization process. A low species utilization process is a process where a thin film or an implant or diffusion is performed by utilizing only a small portion of the reactants within a reaction chamber. More particularly, a low species utilization process may be a process where a thin film is formed using only the reactants in the reaction chamber or a process where the amount of atoms diffused or implanted into a square centimeter of the surface of the substrate is in the approximate range of $1 \times e^{14}$ atoms/cm$^2$ and $1 \times e^{16}$ atoms/cm$^2$.

In low species utilization methods, a gas is flowed into a chamber until a sufficient amount of reactants are present in the chamber for the low utilization process. The gas flow into the reaction chamber is then stopped. Stopping the gas flow into the reaction chamber may entail closing the gate valve (the valve to the vacuum pump) stabilizing the pressure within the chamber by first stabilizing the pressure and then maintaining the pressure while stopping the gas flowing into the reaction chamber. Once the pressure within the chamber is stabilized the low species utilization process may be performed. By closing the gate valve and stabilizing the pressure within the chamber performing the low-species utilization process, the non-uniformity of the amount of atoms diffused into a substrate or the non-uniformity of the thickness of a thin film deposited onto a substrate may be minimized or eliminated. The non-uniformity is minimized or eliminated because there are no longer pressure or flow gradients within the chamber during processing. This "no-flow" method may be applied to decoupled plasma nitridation of a silicon dioxide gate dielectric or high dielectric constant (K) films, such as HaFx, and to forming thin films by rapid thermal processing, chemical vapor deposition, and atomic layer deposition.

Figure 2A:
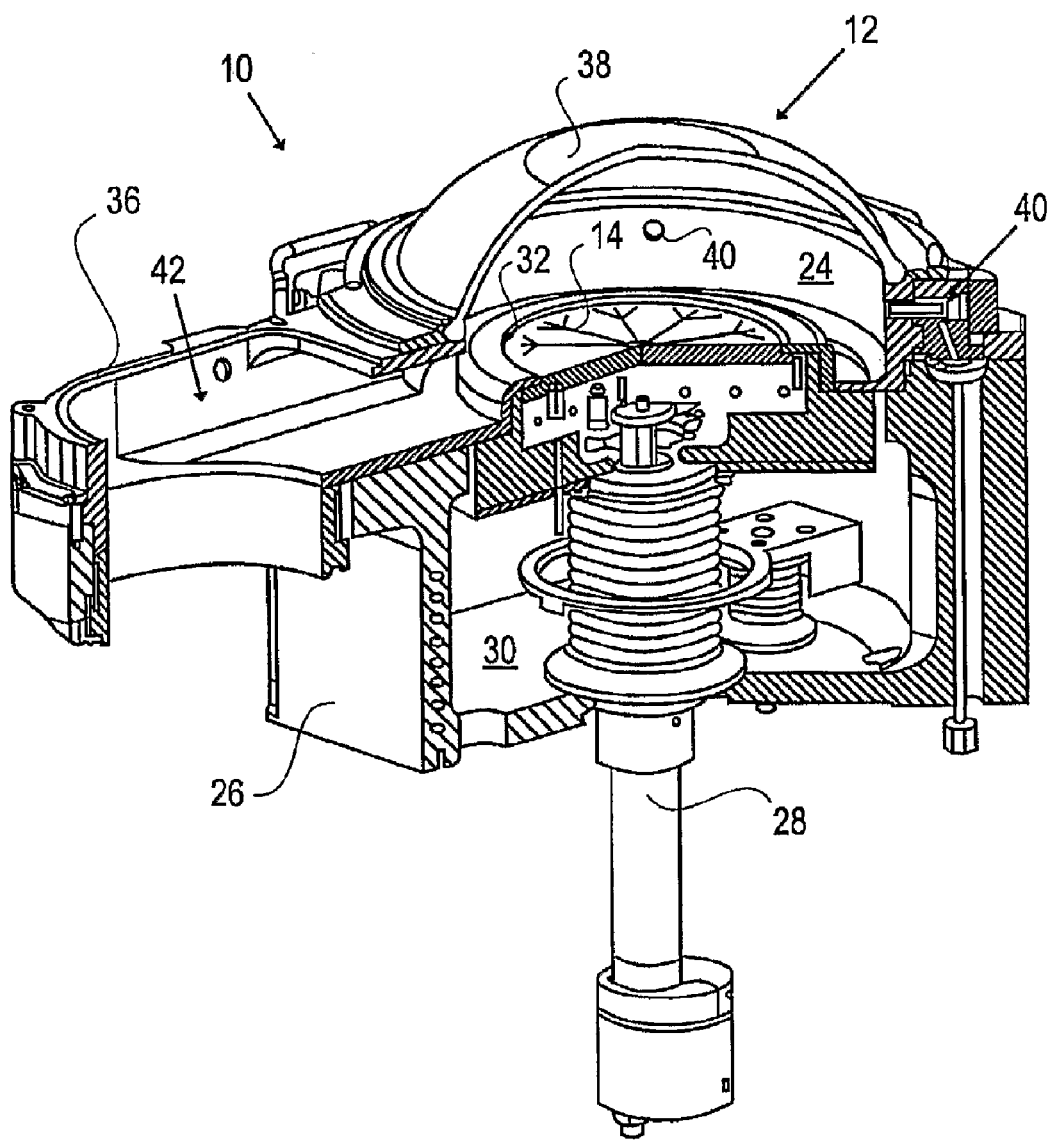
FIG. 2a is an illustration of a cross-sectional view of a decoupled plasma nitridation chamber.

In an embodiment, the low species utilization process is a decoupled plasma nitridation (DPN) process. Nitrogen is diffused into a substrate, such as a silicon dioxide gate dielectric, during a DPN process. FIG. 1 is a flowchart outlining the steps of a DPN process according to the present invention. At block 101, a substrate, such as a monocrystalline silicon wafer, is provided within a DPN chamber 10 as illustrated in FIG. 2, on a substrate holder 14. A cross-section of the substrate that is placed within the DPN chamber is illustrated in FIG. 3. An epitaxial silicon layer 54 is formed on the substrate before the substrate is inserted into the plasma reactor 10 positioned on an upper surface of the substrate holder 14. A thin silicon dioxide layer 58 is grown on the silicon layer 54, also before the substrate is inserted into the plasma reactor 10. The silicon dioxide layer 58 is on the order of a few angstroms (e.g., 40 angstroms) thick, and is later used as a gate dielectric layer in a finally manufactured transistor.

The DPN chamber 10 that is illustrated in FIG. 2 may be designed differently for different diameter wafers or substrates, for example, 200 mm wafers or 300 mm wafers. The DPN chamber 10 is an example of a chamber used to process 200 mm wafers. The DPN chamber 10 includes a lower transfer chamber 26 and a transfer mechanism 28. An upper chamber 12 is positioned on top of the transfer chamber 26. An internal volume 30 of the transfer chamber 26 is placed in communication with the internal volume 24 of the upper chamber 12 through a circular opening 32 in a base of the chamber 12. The substrate holder 14 is secured on top of the transfer mechanism 28, and the transfer mechanism 28 can be used to elevate or lower the substrate holder 14.

In use, the transfer mechanism 28 is operated so that the substrate holder 14 is lowered into the internal volume 30 of the transfer chamber 26. A substrate, positioned on a blade attached to a robot arm, is then transferred through a slit-valve opening in a wall of the transfer chamber 26 into the internal volume 30. The transfer mechanism 28 is then operated to elevate the substrate holder 14 so that the substrate holder 14 contacts a lower surface of the substrate and elevates the substrate off the blade. The blade is then removed from the transfer chamber 26, whereafter the transfer mechanism 28 is again operated to elevate the substrate holder 14 into the opening 32. The substrate, located on the substrate holder 14, has an upper surface that is exposed to the internal volume 24 of the upper chamber 12. The upper chamber 12 includes primarily a conductive body 36 and a dielectric quartz upper wall 38. The conductive body 36 forms a lower portion of the chamber 12, and the upper wall 38 forms an upper portion of the upper chamber 12. The conductive body 36 and the upper wall 38 jointly define the internal volume 24.

Four gas nozzle ports 40 are formed through the conductive body 36 into the internal volume 24. The gas nozzle ports 40 are positioned at 90° intervals around the substrate holder 14. In an alternate embodiment, the DPN chamber 10 may be designed to have a gas nozzle port above the substrate holder 14. The conductive body 36 also defines a vacuum pumping channel 42 on one side thereof. The gas nozzle ports 40 are connected through valves to a gas manifold, and the vacuum pumping channel 42 is connected to a pump. When the pump is operated, gases are extracted from the internal volume 24 through the vacuum pumping channel 42 to reduce a pressure within the internal volume 24. The valves can be operated to allow gases from the manifold (not illustrated) through the valves and the gas nozzle ports 40 into the internal volume 24.

Figure 2B:
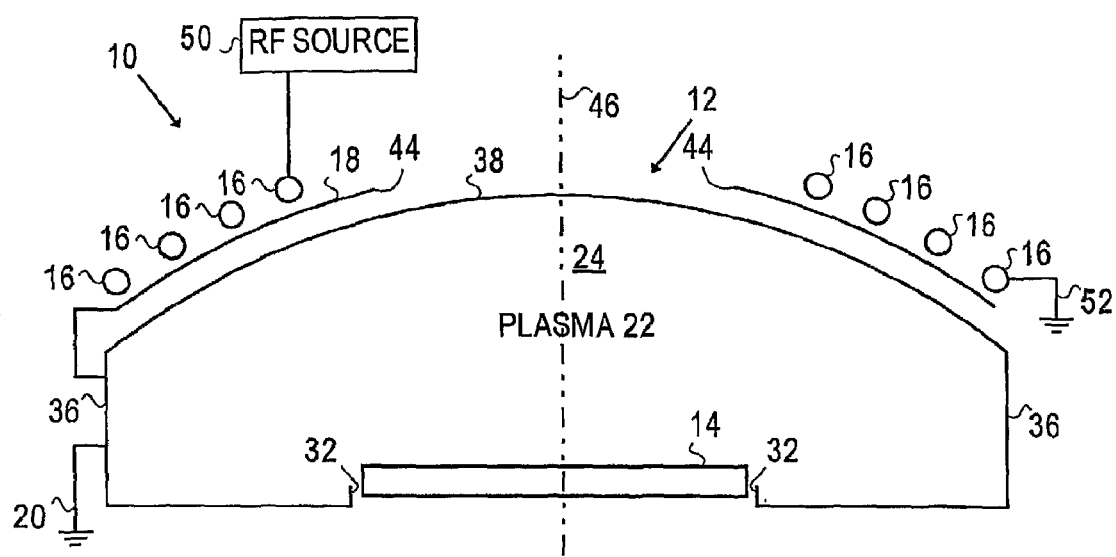
FIG. 2b is an illustration of a cross-sectional view of the interior and RF source of a decoupled plasma nitridation chamber.
Figure 3:
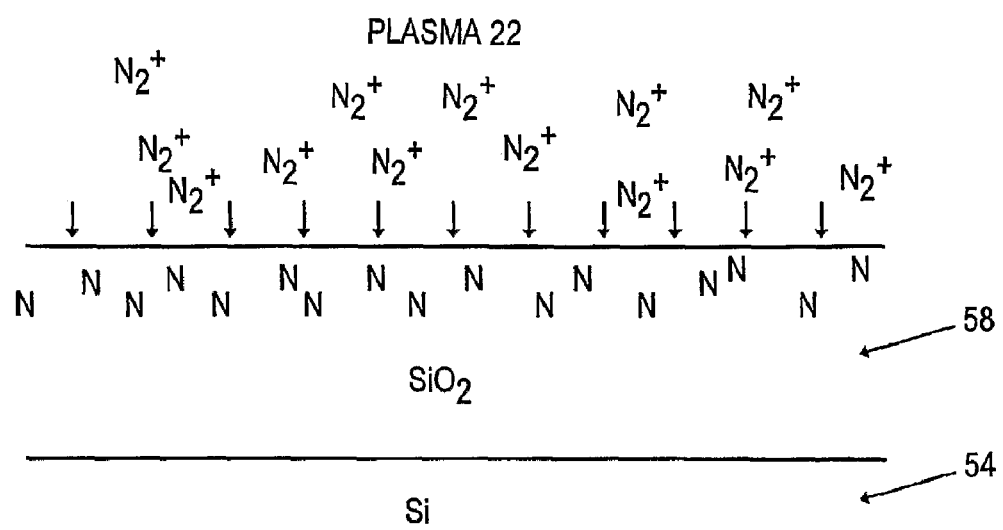
FIG. 3 is an illustration of a cross-sectional view of the diffusion of nitrogen into a silicon dioxide film during a decoupled plasma nitridation process.

Referring more specifically to FIG. 2b, the upper wall 38 has a dome shape, and the electrode plate 18 has a dome shape that conforms to an outer surface of the upper wall 38. The electrode plate 18 is in fact located directly on the upper wall 38. The electrode plate 18 defines a circular opening 44 over a center of the upper wall 38. The upper wall 38 and the electrode plate 18 are symmetrical around a vertical axis 46. The coil 16 spirals around the vertical axis 46 and the opening 44. The coil 16 is positioned on and conforms to the dome shape of the electrode plate 18. One end of the coil 16 is connected to an RF source 50, and an opposing end of the coil 16 is connected to ground 52.

In an alternate embodiment, the DPN chamber may have modifications for a no-flow process. These modifications include the elimination of a vacuum pumping channel, such as 42. The purpose of a vacuum pumping channel is to modulate the flow of gas out of the chamber during processing to minimize flow and pressure gradients that cause non-uniformity in the diffusion of nitrogen into a substrate. Because gas is not being pumped out of the chamber during processing the vacuum pumping channel may no longer be necessary. Also, because no gas is pumped out of the chamber during processing, a turbo pump and the accompanying turbo stack may no longer be necessary. A pump having less pumping ability than a turbo pump may be used because large volumes are gas are not being pumped out of the chamber during processing. Also, the turbo stack that would ordinarily accompany the turbo pump to modulate the flow of gas out of the chamber during processing to minimize flow and pressure gradients may also not be necessary. Additionally, because pressure and flow gradients are no longer an issue during processing the reactions gases may be flowed in and out of the chamber at any position and simple on/off valves may be used for gas input and gas output from the chamber. Because simple on/off valves may be used, the use of complex gas manifolds and mass flow controllers may also not be necessary. These modifications may be made to any process chamber in which a "no-flow" low species utilization process is used, such as rapid thermal processing chambers, chemical vapor deposition chambers, and atomic layer deposition chambers.

At block 102, nitrogen-containing gas is flowed into the internal volume 24 of the DPN chamber 10 once the substrate is in place within the DPN chamber 10. The nitrogen-containing gas may be pure nitrogen ($N_2$), a mixture of nitrogen and helium gases ($N_2$/He), a mixture of nitrogen and neon gases ($N_2$/Ne), or a mixture of nitrogen and argon gases ($N_2$/Ar), or $N_2O$ (either pure or mixed with an inert gas). The uniformity of nitridation performed with $N_2O$ may be greatly improved by a "no-flow" process because $N_2O$ decomposes such that a multi-species reaction results. The amount of the inert gas, such as helium, neon, or argon, that is mixed with the nitrogen gas may be up to approximately 95% of the gas mixture, and more particularly in the approximate range of 30%-90% of the gas mixture. The flow rate of the nitrogen gas into the DPN chamber 10 before the gas flow is stopped may be in the approximate range of 10 sccm/second—50 sccm/second. The amount of nitrogen gas flowed into the chamber may be enough to implant a 300 mm wafer substrate with approximately $1\times10^{14}$ atoms/cm$^2$-$8\times10^{14}$ atoms/cm$^2$. The total internal volume of the chamber, including the internal chamber 24 and the pumping channel 42, may have a volume of approximately 70 liters. The total internal volume of the chamber may be much less than 70 liters depending on whether a pumping channel 42 is present or not. The pumping channel 42 may take up approximately two thirds of the total internal volume. At block 103, the nitrogen gas is flowed into the chamber until the pressure within the internal volume 24 is stabilized. Stabilized pressure is when the pressure is within approximately 0.1 milliTorr of the pressure desired within the chamber for approximately 5 seconds. In one embodiment, after closing the gate valve (the gate to the vacuum pump—not illustrated) the pressure within the internal chamber 24 is stabilized by flowing gas at a slower and slower rate into the internal volume 24 until the pressure within the internal volume 24 is stabilized. Once the pressure is stabilized by reducing the flow rate, a pressure controller maintains the stable pressure during processing. In an alternate embodiment, software may be programmed to control all parameters of the pressure stabilization of the total interior volume of the DPN chamber 10. In this embodiment, the gas flow rate is ramped down by a system controller to which a machine readable medium is coupled, the machine-readable medium having a memory that stores the set of instructions that controls the ramp-down of the gas flow rate. The gas flow rate is ramped down to where a predetermined pressure is achieved within the DPN chamber 10 and then a set of instructions stored in the memory of the machine-readable medium coupled to the system controller stabilizes the pressure within the DPN chamber 10 while the gas flow is stopped. The stabilized pressure within the internal volume 24 may be in the approximate range of 0.1 mTorr-1000 mTorr, or more particularly within the approximate range of 5 mTorr and 95 mTorr, or even more particularly 30 mTorr.

Approximately 1 second to 5 seconds after stopping the gas flow into the internal volume 24 at block 104, a plasma of nitrogen ions (N$^+$) 22 is struck within the internal volume 24 at block 105 above a silicon dioxide layer 58. The plasma of nitrogen ions (N$^+$) 22 formed above a silicon dioxide layer 58 that is formed over a silicon substrate is illustrated in FIG. 3. The nitrogen plasma 22 is struck by the RF source 50 of FIG. 1b. The RF source may create a frequency of approximately 13.56 MHz. The RF coil generates an RF field that is spread by the electrode plate 18 across the upper wall 38. The circular opening 44 permits the RF field to enter through the upper wall 38 into the internal volume 24. The RF may be pulsed at a frequency of 10 kHz. The RF pulse may be at an effective radio frequency power level in the approximate range of 30 W-300 W. The effective power is the power multiplied by the duty cycle. For example, in an embodiment, the effective power is approximately 150 W where the duty cycle is 30% and the full power is 500 W. In this embodiment, the RF is pulsed approximately 33 milliseconds for every 100 milliseconds, therefore resulting in an effective power of approximately 150 milliseconds.

The RF field couples with the nitrogen gas and excites a small number of free electrons. The free electrons then collide with other atoms to release more electrons from the nitrogen atoms. The process is continued until a steady-state condition is achieved, where the nitrogen plasma 22 has a steady amount of free electrons and free ions, a steady electron temperature, and a constant voltage relative to ground. A reservoir of ions is so created within the internal volume 24, and the voltage potential of the nitrogen plasma 22 assists in diffusing ions from this reservoir into the silicon dioxide layer 58 at block 106 of FIG. 1. The potential of the substrate and the substrate holder 14 floats freely during the entire process, but there is a difference in the voltage of the nitrogen plasma 22 and that of the substrate holder 14, the difference driving the diffusion of the nitrogen ions into the silicon dioxide layer 58 at block 106. The diffusion occurs for a time sufficient to implant approximately $1\times10^{14}$ atoms/cm$^2$-$8\times10^{14}$ atoms/cm$^2$ into the substrate to result in approximately 4%-12%, and more particularly 7%-8% nitrogen in the silicon dioxide layer 58. The nitrogen may diffuse throughout the silicon dioxide film because the thickness of the silicon dioxide film may be in the approximate range of 6 Å and 16 Å. The plasma may be struck for a time within the approximate range of 2 seconds-120 seconds, and more particularly in a range of 15 seconds-45 seconds, and even more particularly for 30 seconds. The difference between the uniformity of the nitrogen atoms diffused into the silicon dioxide layer during a process where the gas is flowed during processing compared to a process where the flow is cut off during the processing may be approximately 75%.

After diffusing atoms from the nitrogen plasma 22, the RF is turned off and a purge gas may be flowed through the interior volume 24 of the DPN chamber 20. The substrate may then be removed from the chamber and transferred to a rapid thermal processing chamber to be annealed to increase the nitrogen retention in the silicon dioxide layer 58. The substrate on which the silicon dioxide layer 58 with diffused nitrogen is formed may be annealed at a temperature in the approximate range of 700° C. and 1200° C. degrees C. for approximately 5 seconds and 120 seconds.

Figure 4:
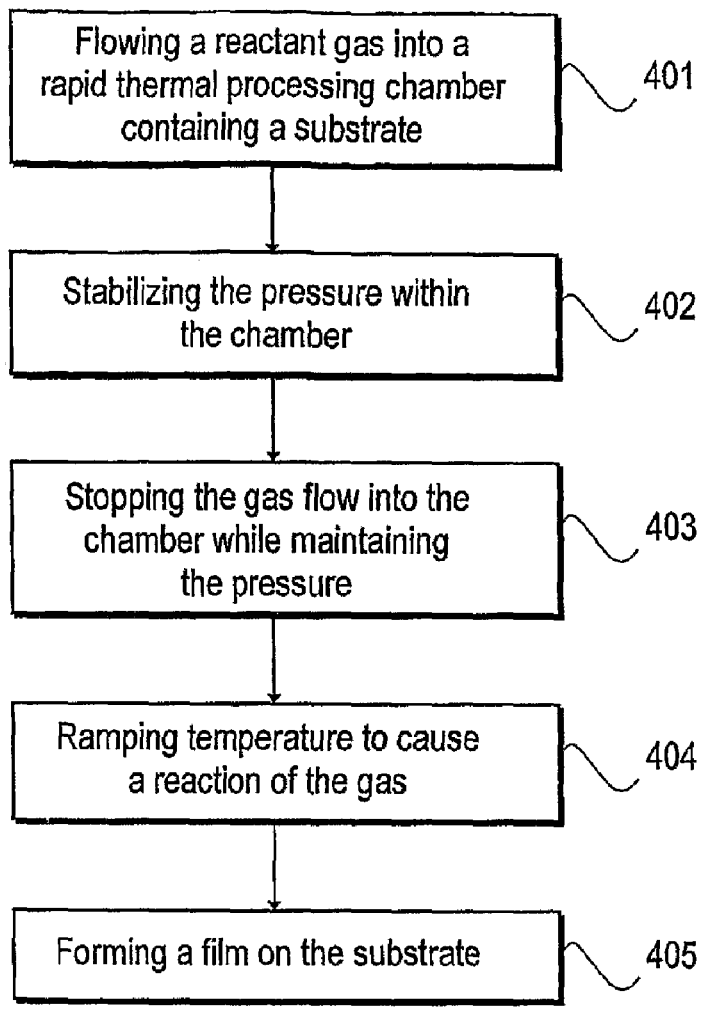
FIG. 4 is a flow chart of a rapid thermal process where a film is formed on a substrate according to an embodiment of the present invention.
Figure 5:
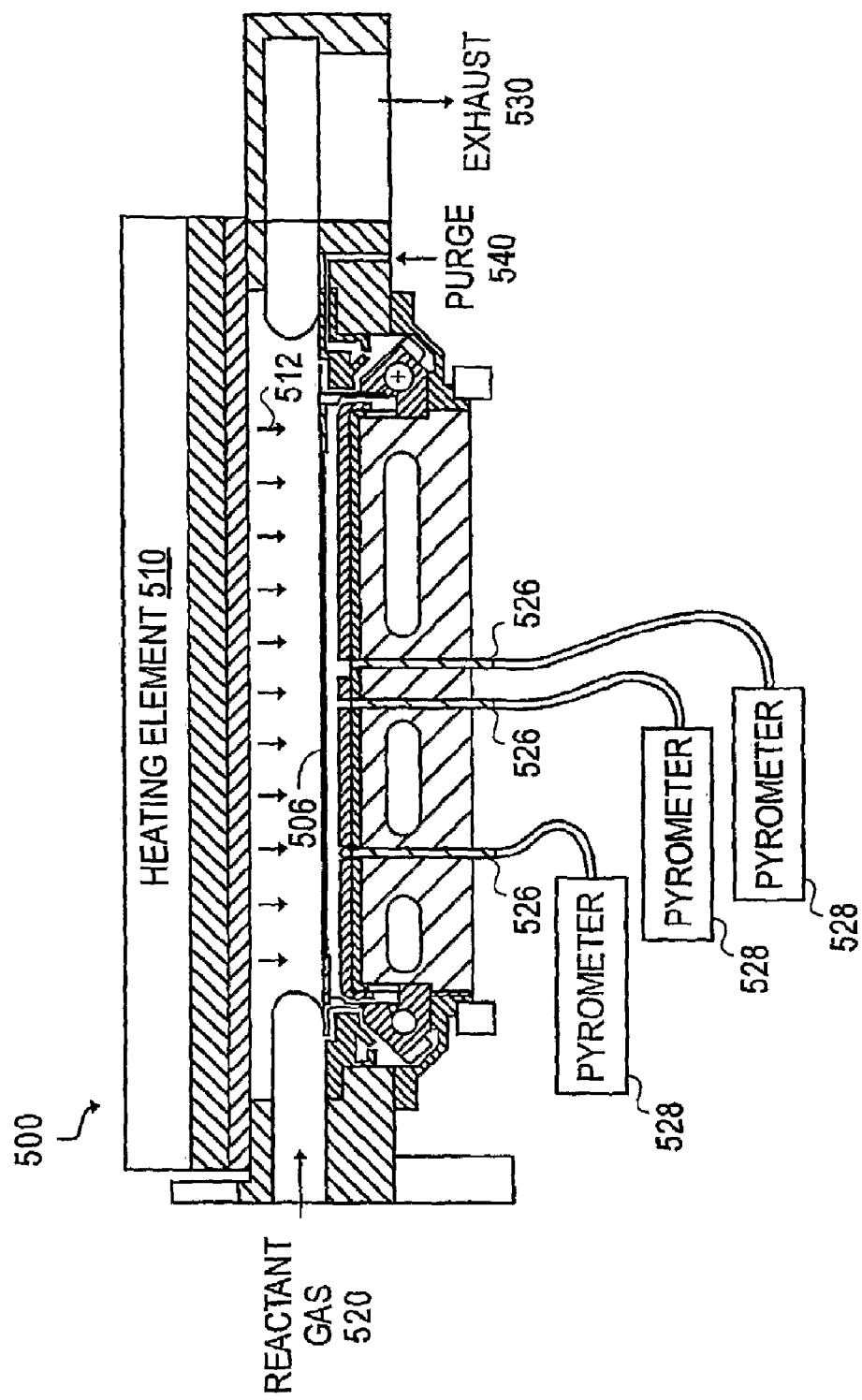
FIG. 5 is a cross-sectional view of a rapid thermal processing chamber.

In an alternate embodiment, the low species utilization process is the formation of a thin film on a substrate using a rapid thermal processing (RTP) chamber, such as the chamber 500 illustrated in FIG. 5. In one particular embodiment, a silicon dioxide film is formed on a silicon substrate 506 using a low species utilization process in the RTP chamber 500. The silicon substrate 506 is mounted inside the RTP chamber 500 on a substrate support structure 508. FIG. 4 is a flowchart of the steps in this embodiment. At block 401, a reactant gas 520 is flowed into the rapid thermal processing (RTP) chamber 500 illustrated in FIG. 5 that contains the silicon substrate 506. The silicon substrate 506 may be a monocrystalline silicon wafer or a silicon on insulator (SOI) wafer. The reactant gases that may be used to form a silicon dioxide film on the silicon substrate may be a mixture of oxygen ($O_2$) and hydrogen ($H_2$) or only oxygen ($O_2$). In the embodiment where a mixture of oxygen ($O_2$) and hydrogen ($H_2$) reactant gases are used, the oxygen and hydrogen form water molecules. In this embodiment, the amount of hydrogen ($H_2$) may be approximately 1%-33% hydrogen ($H_2$), and more particularly approximately 2% hydrogen ($H_2$), and the balance of the mixture is oxygen ($O_2$). The reactant gases are flowed into the RTP chamber 500 at room temperature until the pressure within the chamber is stabilized at block 402. The stabilized pressure may be in the range of 5 Torr and 15 Torr, and more particularly approximately 10 Torr. In one embodiment, the pressure within the RTP chamber 500 is stabilized by flowing gas at a slower and slower rate out of the RTP chamber 500 at the exhaust 530 through a vacuum pump (not illustrated), by adjusting a pressure control valve at the exhaust 530, until the pressure within the RTP chamber 500 is stabilized. Once the pressure is stabilized by reducing the flow rate, a pressure controller maintains the stable pressure during processing. In an alternate embodiment, software may be programmed to control all parameters of the pressure stabilization of the interior volume of the RTP chamber 500. In this embodiment, the gas flow rate is ramped down by a system controller to which a machine-readable medium is coupled, the machine-readable medium having a memory that stores the set of instructions that controls the ramp-down of the gas flow rate. The gas flow rate is ramped down to where a predetermined pressure is achieved within the RTP chamber 500 and then a set of instructions stored in the memory of the machine-readable medium coupled to the system controller stabilizes the pressure within the RTP chamber 500 while the gas flow is stopped. The temperature within the RTP chamber 500 prior to stopping the gas flow is not a temperature sufficient to cause a reaction of the reactant gas or gases. In the embodiment where a mixture of oxygen ($O_2$) and hydrogen ($H_2$) reactant gases are used, the temperature within the RTP chamber 500 prior to stopping the gas flow is a temperature that is not sufficient to form water from the reactants. The temperature sufficient to cause a reaction between $H_2$ and $O_2$ is approximately 600° C. In an embodiment, the temperature within the RTP chamber 500 prior to stopping the gas flow may be approximately room temperature.

At block 403, the gas flow into the RTP chamber 500 is stopped. The substrate 506 is then ramped to a particular temperature to cause a reaction of the reactant gases. In an embodiment, where the reactant gases are $H_2$ and $O_2$, the substrate may be ramped to approximately 600° C. The substrate may be heated by a heating element 510 located directly above the substrate 506. The heating element 510 may be formed of heat lamps such as tungsten halogen lamps. Heat radiation 512 is created to heat the substrate 510. In an alternate embodiment the substrate 506 may be heated by a susceptor containing resistive heating elements, or by both a radiative heating element such as 510 and a susceptor containing resistive heating elements. The ramp rate of the temperature may be greater than 50° C./second and more particularly in the approximate range of 75° C./second and 100° C./second. The temperature to which the substrate is ramped may be greater than 800° C., and more particularly in the approximate range of 800° C. and 1100° C. The temperature of the substrate 506 is measured by the temperature probes 526 and by the pyrometers 528.

Figure 6:
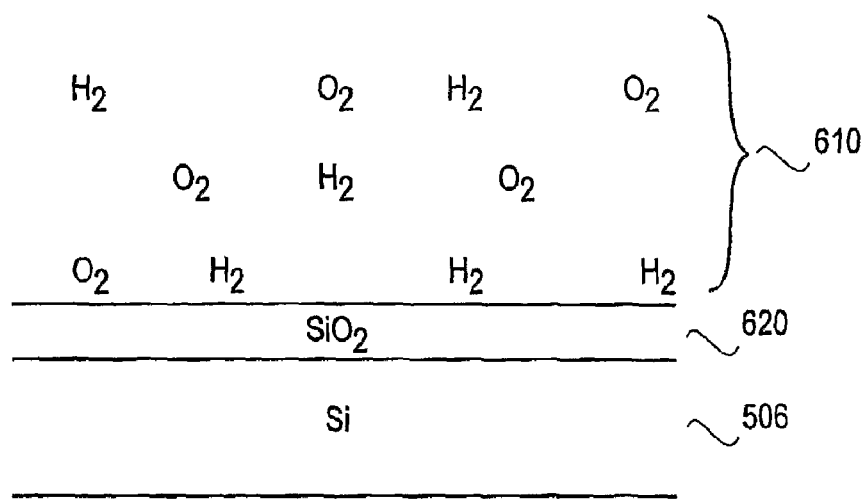
FIG. 6 is a cross-sectional view of the formation of a silicon dioxide film on a silicon substrate during a rapid thermal process of reactant gases.

Once the target temperature is achieved the temperature is held constant for a time sufficient to form a silicon dioxide film 620 with the targeted thickness at block 405. The targeted thickness may be achieved by reducing the temperature to stop the reaction or by using up the reactants within the chamber. FIG. 6 illustrates a silicon dioxide film 620 formed on the silicon substrate 506 by the hydrogen ($H_2$) and oxygen ($O_2$) reactant gases 610. In one embodiment, the thickness of the silicon dioxide film may be within the approximate range of 5 angstroms and 100 angstroms, depending on the intended use of the film. In an embodiment where a silicon dioxide gate dielectric is formed the thickness of the film may be less than approximately 30 angstroms and in one particular embodiment a monolayer of approximately 5 angstroms. In an embodiment where the silicon dioxide forms a liner layer or a sacrificial oxide it may have a thickness in the approximate range of 50 angstroms and 100 angstroms. In an embodiment where the silicon dioxide forms isolation regions the film may have a thickness in the approximate range of 100 angstroms and 200 angstroms. The temperature may be held constant within the approximate range of 15 seconds and 300 seconds. The reaction is self-limiting due to the limited amount of reactants in the chamber, and holding the temperature constant for longer than 300 seconds may result in only insignificant growth. During processing, the substrate may be spun horizontally around the central axis of the substrate at a spin rate in the approximate range of 90 rpm and 240 rpm while forming the silicon dioxide film 620 on the substrate 506. The silicon dioxide film 620 may have a very uniform thickness because no pressure or flow gradients are formed within the chamber during processing due to the lack of gas flowing into and out of the chamber. The uniformity of the thickness of the silicon dioxide film 620 formed in the RTP chamber 500 with a "no-flow" process may be approximately ten times greater than the uniformity of the thickness of a silicon dioxide film formed with a process where gas is flowed into and out of the chamber during processing. For example, a silicon dioxide film of approximately 20 angstroms formed with the "no-flow" process described herein at a temperature of approximately 1000° C. may have a uniformity (variation in thickness) of approximately 0.5% or less.

The temperature within the RTP chamber 500 is then cooled down to approximately room temperature. The RTP chamber 500 is evacuated of the reaction gases once cooled down by opening up a pressure control valve at the exhaust 530. A purge gas such as nitrogen may then be flowed into the RTP chamber 500 at opening 540. The RTP chamber 500 may now be brought to a transfer pressure at which the substrate 506 may be transferred to a transfer chamber in a cluster tool and placed within another chamber for further processing.

In another embodiment a silicon nitride ($Si_3N_4$) film may be formed on a silicon wafer by this process. The silicon nitride film may be used to form thin film capacitors and may have a thickness of less than approximately 30 angstroms. The silicon nitride film may be formed in the RTP chamber 500 with ammonia ($NH_3$) gas at a temperature sufficient to cause the ammonia gas to react of above 700° C., and more particularly above 900° C. The pressure in the chamber to form a silicon nitride film may be greater than approximately 400 Torr. The thickness of the silicon nitride film may be in the approximate range of 10 Å to 25 Å. The silicon nitride film may be grown in a time in the range of 30 seconds to 2 minutes. The reaction of the reactant gases may be slowed or stopped by reducing the temperature within the RTP chamber 500.

In yet another embodiment, an oxynitride film may be formed on a silicon wafer by this process. Growth of an oxynitride layer using $N_2O$ gas is sensitive to pressure and flow gradients and may benefit from a "no-flow" process. An oxynitride film may be formed using reactant gases such as $N_2O$ or NO. These gases may react to form the oxynitride film at temperatures above 700° C. and more particularly above 800° C. at a pressure in the approximate range of 10 Torr and 700 Torr. The oxynitride film may have a thickness in the approximate range of 10 Å and 50 Å. The oxynitride film may be grown in a time in the range of 30 seconds to 2 minutes. The reaction of the reactant gases may be slowed or stopped by reducing the temperature within the RTP chamber 500.

Figure 7:
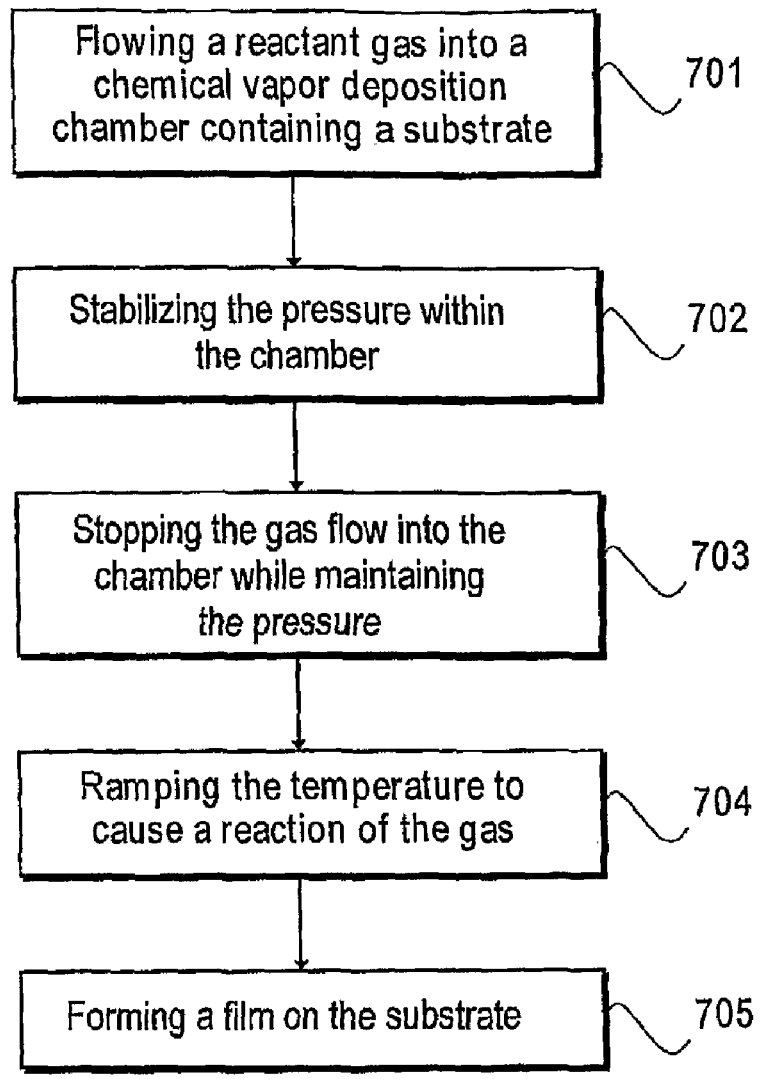
FIG. 7 is a flow chart of a chemical vapor deposition of a film according to an embodiment of the present invention.
Figure 8:
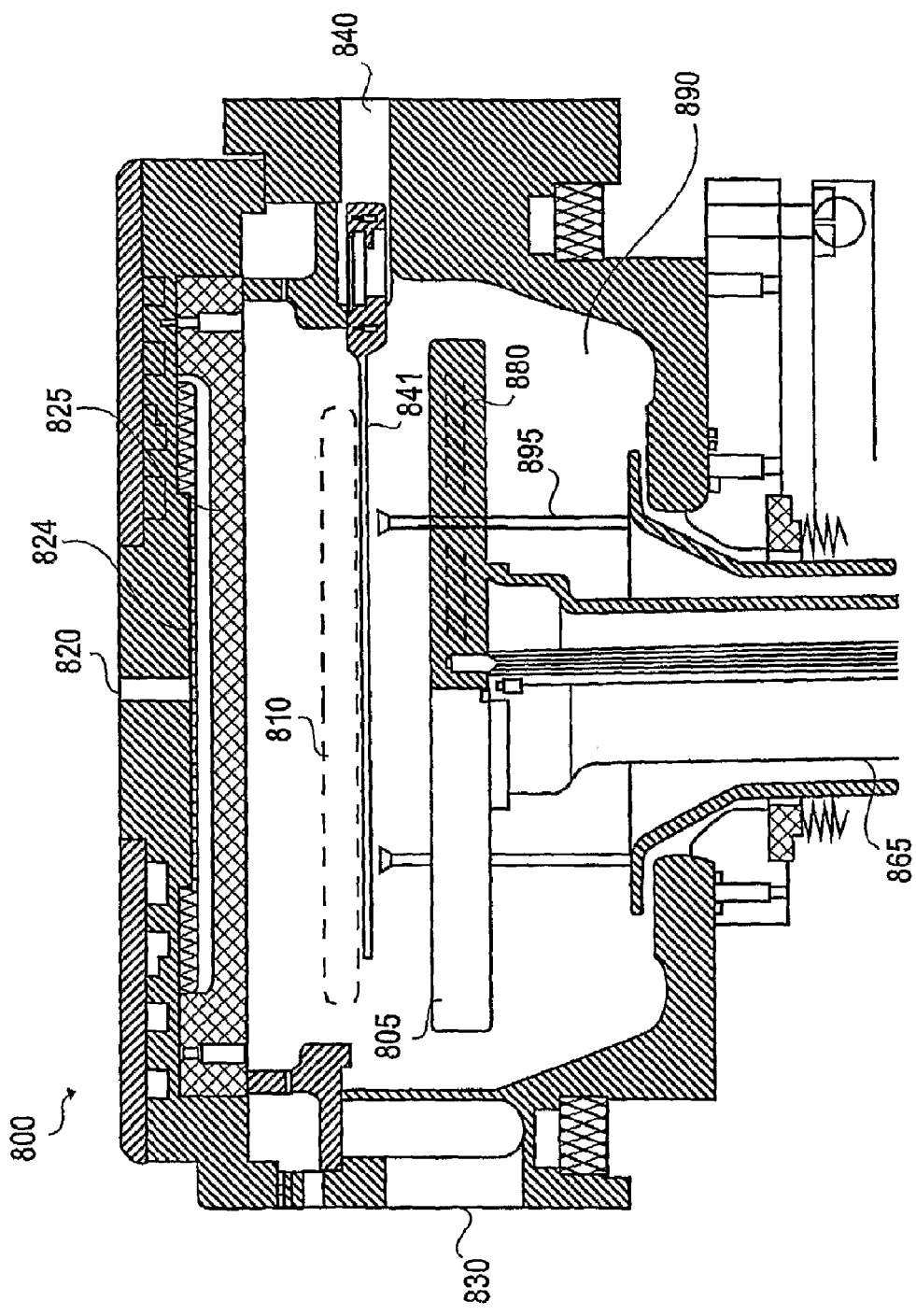
FIG. 8 is a cross-sectional view of a chemical vapor deposition chamber.

In another embodiment, the low species utilization process may be the formation of a thin film by chemical vapor deposition (CVD) in a CVD chamber 800. FIG. 7 is a flowchart of the process of forming a film on a substrate 810 by CVD. The CVD chamber 800 may be a thermal low pressure CVD (LPCVD) apparatus illustrated in FIG. 8. The substrate 810 may be a silicon wafer, or another type of semiconductor or silicon on insulator substrate. The substrate 810 is placed into the interior 890 of the CVD chamber 800 through an entry port 840 by a transfer blade 841. The transfer blade 841 positions the substrate 810 onto the lift pins 895 of the lifter assembly 865. The transfer blade 841 is then removed from the chamber 800 and the lifter assembly moves upwards to bring the susceptor 805 into contact with the substrate 810. The susceptor 805 contains resistive heating elements 880 as illustrated in the cross-sectional portion of the susceptor 805. The heating elements 880 will heat up the susceptor 805 and the substrate 810 during processing. In an alternate embodiment, the susceptor 805 may not contain the resistive heating elements 880, and the wafer 810 and susceptor 805 may be heated by heat lamps positioned both above and below the susceptor 805 within the chamber 800. At block 701, a reactant gas is flowed into the interior 890 of the CVD chamber 800 containing the substrate 810. The reactant gas is flowed into the interior 890 through a manifold (not shown), a distribution port 820, a blocker plate 824, and a showerhead 825. In an alternate embodiment, the manifold and showerhead 825 are not present and only a simple distribution port 820 is used to flow the reactant gases into the interior 890. A manifold and a showerhead are typically used to evenly distribute a specific amount of reactant gases into the interior 890 during processing while maintaining flow of the gases into the interior 890. Because no reactant gases are flowed into the interior 890 during processing, the manifold and showerhead are not necessary. The reactant gas is flowed into the interior 890 of the CVD chamber 800 until a sufficient amount of reactant gas is present in the chamber for a low species utilization process.

Figure 9:
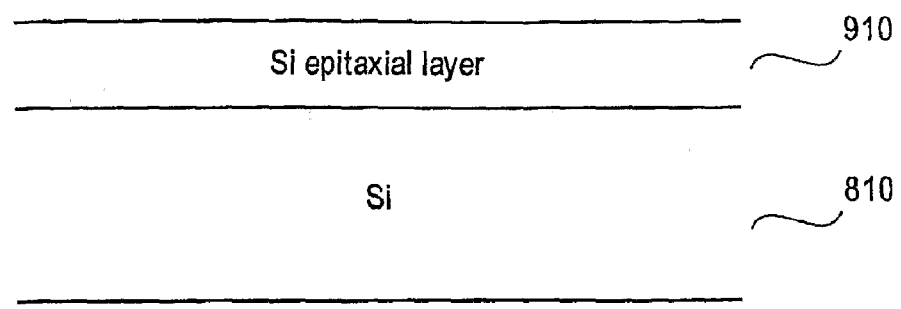
FIG. 9 is a cross-sectional view of a silicon epitaxial layer formed on a silicon substrate by chemical vapor deposition.

In one embodiment, the low species utilization process is a thin film formed by CVD. The thin film may be a silicon film such as a single crystal epitaxial layer, a polysilicon layer, or an amorphous silicon layer formed on a silicon substrate. FIG. 9 illustrates an embodiment where a silicon epitaxial layer 910 is formed over a silicon substrate 810. To form any of the silicon films on the silicon substrate 810 the reactant gas may be a silicon containing gas such as silane ($SiH_4$) or dichlorosilane ($SiH_2Cl_2$) in combination with a carrier gas such as hydrogen ($H_2$). The amount of hydrogen in the mixture with the silicon containing gas may be in the approximate range of 90% and 98%. The reactant gas is flowed into the CVD chamber 800 until there is an amount of the reactant gas sufficient to form an epitaxial silicon film 910 to a particular thickness. The thickness of a single crystal epitaxial film 910 may be in the approximate range of 20 angstroms and 500 angstroms, and more particularly approximately 100 angstroms. The flow of the reactant gas into the interior 890 is not stopped until the pressure within the CVD chamber 800 is stabilized at block 702. The stabilized pressure within the CVD chamber 800 may be in the approximate range of 10 Torr-700 Torr, and more particularly approximately 100 Torr. In one embodiment, the pressure within the CVD chamber 800 is stabilized by flowing gas at an increasingly slower rate out of the CVD chamber 800 through the vacuum pump, by adjusting a pressure control valve, until the pressure within the interior 890 of the CVD chamber 800 is stabilized. Once the pressure is stabilized by reducing the flow rate, the pressure controller maintains the stable pressure during processing. In an alternate embodiment, software may be programmed to control all parameters of the pressure stabilization of the interior volume of the CVD chamber 800. In this embodiment, the gas flow rate is ramped down by a system controller to which a machine readable medium is coupled, the machine-readable medium having a memory that stores the set of instructions that controls the ramp-down of the gas flow rate. The gas flow rate is ramped down to where a predetermined pressure is achieved within the CVD chamber 800 and then a set of instructions stored in the memory of the machine-readable medium coupled to the system controller stabilizes the pressure within the CVD chamber 800 while the gas flow is stopped. The temperature within the CVD chamber 800 prior to stopping the gas flow is not a temperature sufficient to cause a reaction of the reactant gas or gases. In an embodiment, the temperature within the interior 890 of the CVD chamber 800 prior to stopping the gas flow may be approximately room temperature.

At block 703 the flow of the reactant gas into the interior 890 of the CVD chamber 800 is stopped. The temperature of the substrate 810 is then ramped up to a temperature sufficient to cause the reactant gas or gases to react and form a thin epitaxial film 910 on the substrate 810. The substrate 810 is heated by the susceptor 805 which is heated by the resistive heating elements 880 within the susceptor 805. The ramp rate of the temperature may be in the approximate range of 25° C./second-75° C./second, and more particularly approximately 50° C. The temperature to which the wafer is ramped may be in the approximate range of 400° C.-900° C. and more particularly in the approximate range of 600° C.-800° C. The type of silicon layer formed may be controlled by the stabilization temperature at which the silicon layer is grown. In general, at lower temperatures amorphous silicon may formed, then as the temperature is increased the type of silicon formed will proceed from amorphous to polysilicon, to monocrystalline. Once the temperature of the substrate 810 is ramped up to the reaction temperature, the temperature of the substrate 810 is stabilized for a time sufficient to grow the epitaxial silicon film 910 to the desired thickness. At the reaction temperature the reactant gas decomposes on the surface of the hot substrate and the decomposed reactants then grow the epitaxial silicon film 910 on the substrate. The thickness of a single crystal epitaxial film 910 may be in the approximate range of 20 angstroms and 500 angstroms, and more particularly approximately 100 angstroms. In an embodiment where heat lamps are used to heat the substrate and the susceptor, the substrate may be spun horizontally around the central axis of the substrate at a spin rate in the approximate range of 20 rpm and 50 rpm while growing the expitaxial silicon film 910 on the substrate. The uniformity of the thickness of the single crystal epitaxial film 910 may be improved by using the "no-flow" process described herein. The uniformity of the thickness of the film 910 is improved because the reactant gases are not flowed into and out of the CVD chamber 800 during the growth of the single crystal epitaxial film 910 to cause flow and pressure gradients.

The temperature of the susceptor 805 and within the CVD chamber 800 is then cooled down to approximately room temperature in order to cool down the substrate 810. The CVD chamber 800 may then be evacuated of the reactant gases once cooled down by opening up a pressure control valve (not illustrated) positioned gas output 830. A purge gas such as hydrogen ($H_2$) or nitrogen ($N_2$) may then be flowed into the interior 890 of the CVD chamber 800. The CVD chamber 800 may now be brought to a transfer pressure at which the substrate 810 may be transferred to a transfer chamber in a cluster tool and placed within another chamber for further processing.

In an alternate embodiment, the film formed in a "no-flow" low species utilization process by CVD may be silicon dioxide, or silicon nitride. The parameters for growing other amorphous films such as silicon dioxide and silicon nitride would be similar to that of forming epitaxial silicon films. The main difference is that other gases such as oxygen or ammonia would be introduced in addition to the main silicon precursor such as $SiH_4$, $Si_2H_6$, or $Si_2H_2Cl_2$. The temperatures and pressures may be slightly different than those used to grow epitaxial silicon.

The "no-flow" low species utilization embodiments described herein are examples of some of the applications of this invention. Stopping the flow of gases into a reaction chamber during processing is a concept that may be extended to other low species utilization processes such as atomic layer deposition or dopant implants. It is to be appreciated that the disclosed specific embodiments are only meant to be illustrative of the present invention and one of ordinary skill in the art will appreciate the ability to substitute features or to eliminate disclosed features. As such, the scope of the Applicant's invention is to be measured by the appended claims that follow.

We claim:

1. A method, comprising:
    flowing a gas into a chamber;
    stopping the gas flowing into the chamber; and
    performing a low species utilization process within the chamber after minimizing pressure and flow gradients within the chamber, the low species utilization process comprising:
    striking a plasma at a first voltage;
    applying a floating voltage to a substrate holder; and
    diffusing an amount of atoms into a substrate in an approximate range of $1 \times e^{14}$ atoms/cm$^2$ and $1 \times e^{16}$ atoms/cm$^2$ while striking the plasma, wherein no gas flows into the chamber while performing the low species utilization process and a difference in voltage of the first voltage and the floating voltage drives the diffusing of the atoms into the substrate.

2. The method of claim 1, wherein stopping the gas flowing into the chamber comprises stabilizing the pressure within the chamber, closing a gate valve of the chamber, and maintaining the pressure within the chamber while stopping the gas flowing into the chamber.

3. The method of claim 1, wherein performing the low species utilization process comprises a decoupled plasma nitridation.

4. A method, comprising:
    flowing a gas into a plasma chamber;
    stopping the gas flowing into the plasma chamber;
    striking a plasma including the gas at a first voltage above a substrate after stopping the gas flowing into the plasma chamber;
    applying a floating voltage to a substrate holder; and
    diffusing nitrogen into the substrate while striking the plasma;
    wherein no gas flows into the chamber and no gas is pumped out of the plasma chamber while striking the plasma, and a difference in voltage of the first voltage and floating voltage drives the diffusing of the nitrogen into the substrate.

5. The method of claim 4, further comprising stabilizing the pressure within the plasma chamber before striking the plasma.

6. The method of claim 4, further comprising maintaining a stable pressure within the plasma chamber while striking the plasma.

7. The method of claim 4, wherein diffusing comprises implanting nitrogen into the substrate in an approximate range of $1 \times e^{14}$ atoms/cm$^2$ and $1 \times e^{16}$ atoms/cm$^2$.

8. The method of claim 4, wherein the nitrogen diffuses into a silicon dioxide gate.

9. A method, comprising:
    flowing a nitrogen gas into a decoupled plasma nitridation chamber, the decoupled plasma nitridation chamber having an internal pressure;
    closing the gate valve of the decoupled plasma nitridation chamber;
    stabilizing the internal pressure of the decoupled plasma nitridation chamber to obtain a stabile pressure;
    maintaining the stable pressure within the decoupled plasma nitridation chamber while stopping the gas flowing into the decoupled plasma nitridation chamber; and
    striking a plasma at a first voltage above a substrate after stopping the nitrogen gas flowing into the chamber and after stabilizing the internal pressure of the chamber;
    applying a floating voltage to a substrate holder; and
    diffusing nitrogen into the substrate while striking the plasma;
    wherein no gas flows into the decoupled plasma nitridation chamber and no gas is pumped out of the decoupled plasma nitridation chamber while striking the plasma, and a difference in voltage of the first voltage and the floating voltage drives the diffusing of the nitrogen into the substrate.

10. The method of claim 9, wherein diffusing comprises implanting the nitrogen in an approximate range of $1 \times 10^{14}$ atoms/cm$^2$ and $8 \times 10^{14}$ atoms/cm$^2$ into a silicon dioxide film on a 300 mm wafer.

11. The method of claim 9, wherein striking a plasma comprises providing a coil about a roof of the plasma nitridation chamber and energizing the coil with radio frequency (RF) power.

12. The method of claim 9, wherein stabilizing the internal pressure of the decoupled plasma nitridation chamber comprises bringing the internal pressure to within approximately 5 mTorr and 95 mTorr.

13. The method of claim 9, wherein stabilizing the internal pressure of the decoupled plasma nitridation chamber comprises bringing the internal pressure to approximately 20 mTorr.

14. The method of claim 9, further comprising maintaining the stabilized internal pressure while striking a plasma.

15. The method of claim 9, wherein maintaining the stable pressure within the decoupled plasma nitridation chamber comprises ramping down the nitrogen gas flow at a rate in the approximate range of 10 sccm/second and 50 sccm/second.

16. The method of claim 9, wherein striking the plasma comprises applying an effective radio frequency in the approximate range of 30 W to 300 W.

17. The method of claim 9, wherein striking the plasma comprises applying an effective radio frequency of approximately 150 W.

* * * * *

UNITED STATES PATENT AND TRADEMARK OFFICE
CERTIFICATE OF CORRECTION

| | | |
|---|---|---|
| PATENT NO. | : 7,955,646 B2 | Page 1 of 1 |
| APPLICATION NO. | : 10/914964 | |
| DATED | : June 7, 2011 | |
| INVENTOR(S) | : James P. Cruse et al. | |

It is certified that error appears in the above-identified patent and that said Letters Patent is hereby corrected as shown below:

Column 12, line 22, the text "stabile" should read --stable--

Signed and Sealed this
Twenty-third Day of August, 2011

David J. Kappos
*Director of the United States Patent and Trademark Office*